US011953386B2

(12) United States Patent
Lee

(10) Patent No.: US 11,953,386 B2
(45) Date of Patent: Apr. 9, 2024

(54) METHOD AND SYSTEM FOR ESTIMATING JUNCTION TEMPERATURE OF POWER SEMICONDUCTOR DEVICE OF POWER MODULE

(71) Applicants: Hyundai Motor Company, Seoul (KR); Kia Motors Corporation, Seoul (KR)

(72) Inventor: Je Hwan Lee, Gyeonggi-do (KR)

(73) Assignees: Hyundai Motor Company, Seoul (KR); Kia Motors Corporation, Seoul (KR)

(*) Notice: Subject to any disclaimer, the term of this patent is extended or adjusted under 35 U.S.C. 154(b) by 263 days.

(21) Appl. No.: 17/086,589

(22) Filed: Nov. 2, 2020

(65) Prior Publication Data
US 2021/0333157 A1 Oct. 28, 2021

(30) Foreign Application Priority Data
Apr. 28, 2020 (KR) .......... 10-2020-0051841

(51) Int. Cl.
*G01K 7/01* (2006.01)
*G01K 13/00* (2021.01)
(Continued)

(52) U.S. Cl.
CPC ............ *G01K 7/015* (2013.01); *G01K 13/00* (2013.01); *G01K 2217/00* (2013.01); *H01L 23/473* (2013.01); *H01L 25/18* (2013.01)

(58) Field of Classification Search
CPC ....... H01L 29/7393; H01L 2924/13055; H01L 29/7395; H01L 23/473; H01L 25/18; G01K 7/015; G01K 13/00; G01K 2217/00
See application file for complete search history.

(56) References Cited

U.S. PATENT DOCUMENTS

2007/0073510 A1* 3/2007 Kerkman ............... H02M 7/00
374/E7.043
2012/0218027 A1* 8/2012 Ioannidis ............. H02M 7/003
327/513
(Continued)

FOREIGN PATENT DOCUMENTS

KR 10-2014-0047758 4/2014
KR 10-2014-0047758 A 4/2014
(Continued)

*Primary Examiner* — Mohamed Charioui
*Assistant Examiner* — Dacthang P Ngo
(74) *Attorney, Agent, or Firm* — Fox Rothschild LLP

(57) ABSTRACT

A method for estimating the junction temperature of the power semiconductor device of the power module is provided. The method includes computing a junction temperature prediction value of the first power semiconductor device based on a power loss and a thermal resistance of the first power semiconductor device and computing a junction temperature prediction value of the second power semiconductor device based on a power loss and a thermal resistance of the second power semiconductor device. A temperature prediction value of the heat sink is computed by subtracting the junction temperature prediction value of the first power semiconductor device from a sensing temperature sensed by the temperature sensor. The junction temperature of the second power semiconductor device is then finally determined by adding the temperature prediction value of the heat sink to the junction temperature prediction value of the second power semiconductor device.

11 Claims, 5 Drawing Sheets

(51) Int. Cl.
*H01L 23/473* (2006.01)
*H01L 25/18* (2023.01)

(56) References Cited

U.S. PATENT DOCUMENTS

| | | | | |
|---|---|---|---|---|
| 2017/0020034 A1* | 1/2017 | Kondo | ............... | H05K 7/20909 |
| 2018/0172522 A1* | 6/2018 | Lee | ........................ | G01K 7/01 |
| 2019/0250205 A1* | 8/2019 | Sarwar | ................ | G08B 21/182 |

FOREIGN PATENT DOCUMENTS

| KR | 10-156725 | 11/2015 |
|---|---|---|
| KR | 10-1567256 | 11/2015 |
| KR | 10-2018-0069954 | 6/2018 |
| KR | 10-2018-0069954 A | 6/2018 |

\* cited by examiner

METHOD AND SYSTEM FOR ESTIMATING JUNCTION TEMPERATURE OF POWER SEMICONDUCTOR DEVICE OF POWER MODULE

CROSS REFERENCE TO RELATED APPLICATION

The present application claims priority of Korean Patent Application No. 10-2020-0051841 filed on Apr. 28, 2020, the entire contents of which is incorporated herein for all purposes by this reference.

BACKGROUND

Field of the Disclosure

The present disclosure relates to a method and a system for estimating a junction temperature of a power semiconductor device of a power module, and more particularly, to a method and a system for estimating a junction temperature of a power semiconductor device of a power module, which appropriately estimates a junction temperature of a power semiconductor device which does not have an embedded temperature sensor even when abnormality occurs in a cooling system supplying coolant to a power module.

Description of the Related Art

Generally, an inverter which converts a direct current power is needed to generate a three-phase alternating current power to drive a motor. The inverter includes a power module that has a power semiconductor device which performs a switching operation such as an insulated gate bipolar transistor (IGBT) and a diode. The power semiconductor device of the power module needs to be managed within a predetermined maximum allowable temperature to prevent burning and maintain endurance life.

Conventionally, the temperature for the power module is managed by applying a thermal model which estimates a junction temperature of the corresponding power semiconductor device based on a switching frequency, a current, a voltage, or the like of the power semiconductor device in the power module.

A technique of estimating the junction temperature of the power semiconductor device using a conventional thermal model applies the coolant temperature supplied to cool the power semiconductor device to the estimation of the junction temperature. Since the coolant temperature is mainly measured by a coolant temperature sensor installed to an inlet of a coolant passage to which the coolant is supplied, even when the coolant is not actually, properly transferred to a location at which the power module is installed and thus the temperature of the power module increases, a junction temperature estimation value does not properly reflect such an increase in temperature.

Particularly, the IGBT of the power semiconductor device commercialized recently may have an embedded temperature sensor to detect the increase in temperature due to the coolant supply abnormality, but since a diode which is another power semiconductor device does not embed the temperature sensor, the junction temperature is still predicted to be low even when the temperature is increased by the coolant supply abnormality, thereby causing bunting and reducing the endurance life of the power module.

The foregoing explained as the background is intended merely to aid in the understanding of the background of the present disclosure, and is not intended to mean that the present disclosure falls within the purview of the related art that is already known to those skilled in the art.

SUMMARY

Accordingly, the present disclosure provides a method and a system for estimating a junction temperature of a power semiconductor device of a power module, which may appropriately estimate a junction temperature of a power semiconductor device which does not have an embedded temperature sensor even when abnormality occurs in a cooling system supplying coolant to a power module.

According to one aspect, the present disclosure provides a method for estimating a junction temperature of a power semiconductor device of a power module including a first power semiconductor device disposed adjacent to a heat sink for cooling and having a temperature sensor, and a second power semiconductor device disposed adjacent to the first power semiconductor device and having no temperature sensor. The method may include computing a junction temperature prediction value of the first power semiconductor device based on a power loss and a thermal resistance of the first power semiconductor device; computing a junction temperature prediction value of the second power semiconductor device based on a power loss and a thermal resistance of the second power semiconductor device; computing a temperature prediction value of the heat sink by subtracting the junction temperature prediction value of the first power semiconductor device from a sensing temperature sensed by the temperature sensor; and finally determining the junction temperature of the second power semiconductor device by adding the temperature prediction value of the heat sink to the junction temperature prediction value of the second power semiconductor device.

In an exemplary embodiment of the present disclosure, the computing of the junction temperature prediction value of the first power semiconductor device may include: calculating a power loss of the first power semiconductor device; and computing the junction temperature prediction value of the first power semiconductor device by multiplying the power loss of the first power semiconductor device by a preset thermal resistance of the first power semiconductor device.

In addition, the calculating of the power loss of the first power semiconductor device may include calculating the power loss of the first power semiconductor device using a predetermined power loss computational formula using a plurality of parameters related to an operation of the power module as variables. The thermal resistance of the first power semiconductor device may be determined in advance by a method for measuring a change in the temperature of the first power semiconductor device for each liter per minute of coolant flowing through the heat sink.

In the exemplary embodiment of the present disclosure, the computing of the junction temperature prediction value of the second power semiconductor device may include: calculating a power loss of the second power semiconductor device; and computing the junction temperature prediction value of the second power semiconductor device by multiplying the power loss of the second power semiconductor device by a preset thermal resistance of the second power semiconductor device.

The calculating of the power loss of the second power semiconductor device may include calculating the power loss of the second power semiconductor device using a predetermined power loss computational formula using a plurality of parameters related to an operation of the power module as variables. Additionally, the thermal resistance of the second power semiconductor device may be determined in advance by a method for measuring a change in the temperature of the second power semiconductor device for each liter per minute of coolant flowing through the heat sink in advance.

The method for estimating the junction temperature of the power semiconductor device of the power module may further include: derating an operation of the power module or stopping the operation of the power module, if the finally determined junction temperature of the second power semiconductor device is greater than a preset reference value. The first power semiconductor device may be an IGBT, and the second power semiconductor device may be a diode.

According to another aspect, the present disclosure provides a system for estimating a junction temperature of a power semiconductor device of a power module including a first power semiconductor device disposed adjacent to a heat sink for cooling and having a temperature sensor, and a second power semiconductor device disposed adjacent to the first power semiconductor device and having no temperature sensor. The system may include a memory configured to store a predetermined power loss computational formula of each of the first and second power semiconductor devices using a plurality of parameters related to the operation of the power module as variables and a thermal resistance of each of the first and second power semiconductor devices predetermined by a method of measuring changes of the temperatures of the first and second power semiconductor devices for each liter per minute of coolant flowing through the heat sink; and a processor configured to determine a junction temperature of the second power semiconductor device based on information stored in the memory and a sensing temperature of the temperature sensor.

The processor may be configured to receive the parameters related to the operation of the power module to calculate the power loss of the first power semiconductor device, and compute a junction temperature prediction value of the first power semiconductor device based on the power loss and the thermal resistance of the first power semiconductor device. Additionally, the processor may be configured to receive the parameters related to the operation of the power module to calculate the power loss of the second power semiconductor device, and compute a junction temperature prediction value of the second power semiconductor device based on the power loss and the thermal resistance of the first power semiconductor device.

Further, the processor may be configured to compute a temperature prediction value of the heat sink by subtracting the junction temperature prediction value of the first power semiconductor device from the sensing temperature sensed by the temperature sensor provided in the first power semiconductor device, and finally determine the junction temperature of the second power semiconductor device by adding the temperature prediction value of the heat sink to the junction temperature prediction value of the second power semiconductor device.

In the exemplary embodiment of the present disclosure, the memory may be configured to store a predetermined reference value for a comparison with the second power semiconductor device, and the processor may be configured to derate an operation of the power module or stop the operation of the power module, if the finally determined junction temperature of the second power semiconductor device is greater than the reference value. The first power semiconductor device may be an IGBT, and the second power semiconductor device may be a diode.

The method and system for estimating the junction temperature of the power semiconductor device of the power module may derive the temperature of the heat sink for cooling the power module by utilizing the thermal model of the power semiconductor device in which the temperature sensor is embedded and the sensing temperature of the temperature sensor, and utilize the derived temperature of the heat sink to predict the junction temperature of the power semiconductor device in which the temperature sensor is not embedded, thereby improving the accuracy of predicting the junction temperature of the power semiconductor device in which the temperature sensor is not embedded.

Particularly, the method and system for estimating the junction temperature of the power semiconductor device of the power module may predict the junction temperature of the power semiconductor device in which the temperature sensor is not embedded even in the state where a problem occurs in the system providing the coolant to the heat sink of the power module and thus the temperature of the heat sink is not accurately detected to accurately confirm the over-temperature of the junction temperature of the power semiconductor device, thereby preventing the device from being broken or the operation of the device from being stopped and the endurance life of the device from being reduced due to the over-temperature of the junction temperature.

The effects obtainable in the present disclosure are not limited to the aforementioned effects, and other effects not mentioned may be clearly understood by those skilled in the art to which the present disclosure pertains from the following description.

BRIEF DESCRIPTION OF THE DRAWINGS

The above and other objects, features and other advantages of the present disclosure will be more clearly understood from the following detailed description when taken in conjunction with the accompanying drawings, in which.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, combustion, plug-in hybrid electric vehicles, hydrogen-powered vehicles and other alternative fuel vehicles (e.g. fuels derived from resources other than petroleum).

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor and is specifically programmed to execute the processes described herein. The memory is configured to store the modules and the processor is specifically configured to execute said modules to perform one or more processes which are described further below.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter, a method and a system for estimating a junction temperature of a power semiconductor device of a power module according to various exemplary embodiments of the present disclosure will be described in detail with reference to the accompanying drawings.

Figure 1:
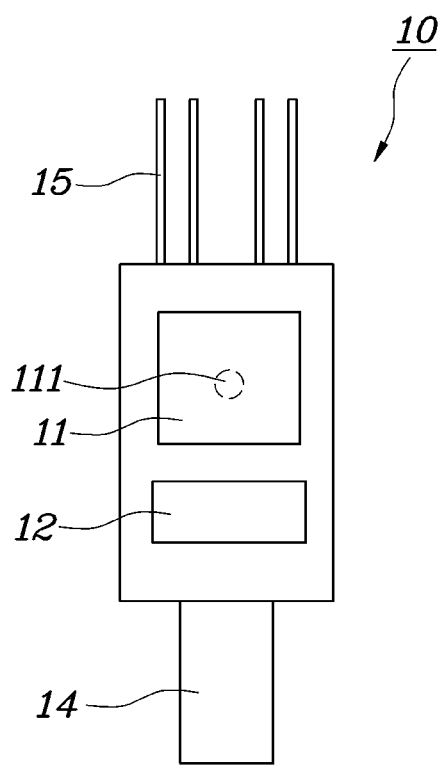
FIG. 1 is a plane diagram illustrating a portion of a power module to which various exemplary embodiments of the present disclosure are applied.

First, a structure of a power module to which various exemplary embodiments of the present disclosure are applied will be briefly described. FIG. 1 is a plan diagram illustrating a portion of a power module to which various exemplary embodiments of the present disclosure are applied, and FIG. 2 is a cross-sectional diagram illustrating an example of a portion of the power module to which various exemplary embodiments of the present disclosure are applied.

Figure 2:
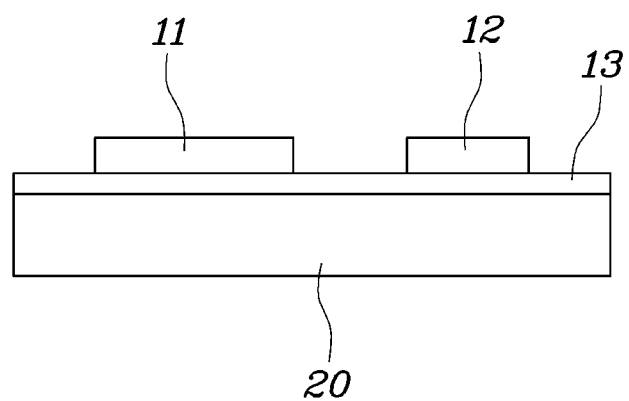
FIG. 2 is a cross-sectional diagram illustrating an example of a portion of the power module to which various exemplary embodiments of the present disclosure are applied.

Referring to FIGS. 1 and 2, a power module 10 may include a plurality of IGBTs 11 and diodes 12 disposed on a substrate 13. Although not illustrated in FIGS. 1 and 2, the IGBT 11 and the diode 12 may be electrically connected to each other with a power line implemented as a conductive pattern or the like formed on the substrate 13, and the power lines may exchange the power with other external electrical components through a power lead 14 as illustrated in FIG. 2. In addition, although not illustrated, the IGBT 11 and the diode 12 may be connected to signal leads 15 via a wire connection to receive a signal for the control from the outside.

The power module 10 may be disposed adjacent to a heat sink 20 to be in close or abutting contact with the substrate 13 under the substrate 13. Additionally, a coolant for decreasing the temperature of the power module may flow through the heat sink 20. Although it is illustrated in FIG. 2 that as the heat sink 20, one heat sink 20 is installed under the substrate 13, cooling structures of various methods are known in the art and the present disclosure is not limited by the example illustrated in FIG. 2. The liter per minute and temperature of the coolant flowing to the heat sink 20 may be applied to predict the junction temperature of the power semiconductor devices 11, 12 in the power module 10, which will be described later.

In FIGS. 1 and 2, the IGBT 11 corresponding to a first power semiconductor device is a device having a temperature sensor 111 inside the device. Accordingly, the junction temperature of the first power semiconductor device 11 may be a sensing value sensed by the temperature sensor 111. Meanwhile, the diode 12 corresponding to a second power semiconductor device is a device in which the temperature sensor is not embedded inside the device, and needs to estimate the junction temperature through computation by a temperature estimation technique. In a conventional junction temperature estimation technique, the coolant temperature flowing through the heat sink 20 is used for computing the junction temperature, and if the coolant temperature applied to the computation for estimating the junction temperature is different from the actual temperature of the coolant flowing through a contact area between the power module and the heat sink, the estimation of the junction temperature of a second power semiconductor device may be inaccurate.

Figure 3:
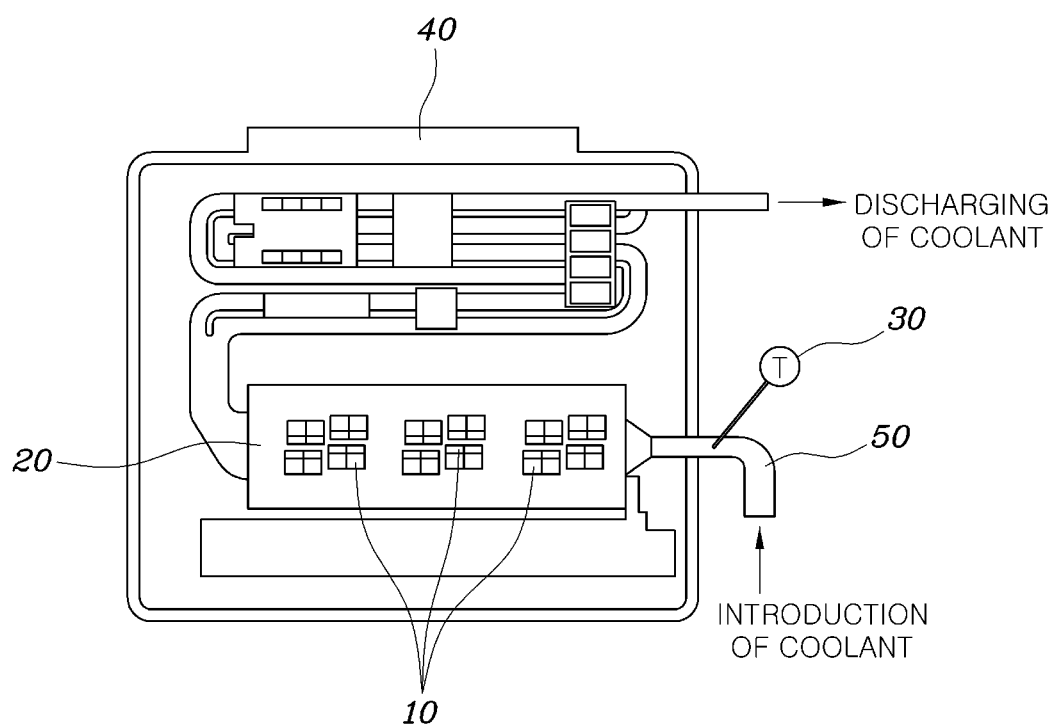
FIG. 3 is a diagram briefly illustrating a power module cooling system to which various exemplary embodiments of the present disclosure are applied.

FIG. 3 is a diagram briefly illustrating a power module cooling system to which various exemplary embodiments of the present disclosure are applied. As illustrated in FIG. 3, the power module 10 may be disposed inside a housing 40 together with other components for performing related functions, and the heat sink 20 may be disposed to contact the power module 10 inside the housing 40. The coolant flowing through the heat sink 20 may be supplied from a coolant inlet 50 outside the housing 40, and a water temperature sensor 30 configured to measure the coolant temperature may be located outside the housing 40 corresponding to a point where the housing 40 and the coolant inlet 50 meet. In other words, the water temperature sensor 30 may be configured to sense the coolant temperature immediately before the coolant is introduced into the housing 40.

The coolant temperature sensing structure may be configured to sense the coolant temperature at a temperature substantially lower than the actual coolant in the heat sink 20 even when the coolant is not smoothly supplied into the heat sink 20. Accordingly, if the junction temperature of the second power semiconductor device 12 of the power module 10 is estimated as described above using the coolant temperature sensed by the water temperature sensor 30, the estimated junction temperature may be computed as a value that is less than that of the actual junction temperature, so that failure to predict an increase in the junction temperature may cause serious problems such as burning of the device or an error of the operation of the entire system.

Various exemplary embodiments of the present disclosure provide a technology of more accurately estimating the coolant temperature in the heat sink 20 adjacent to the power module 10 using the junction temperature of the power semiconductor device having the embedded temperature sensor, and thus more accurately estimating the junction temperature of another power semiconductor device in which the temperature sensor is not embedded.

Figure 4:
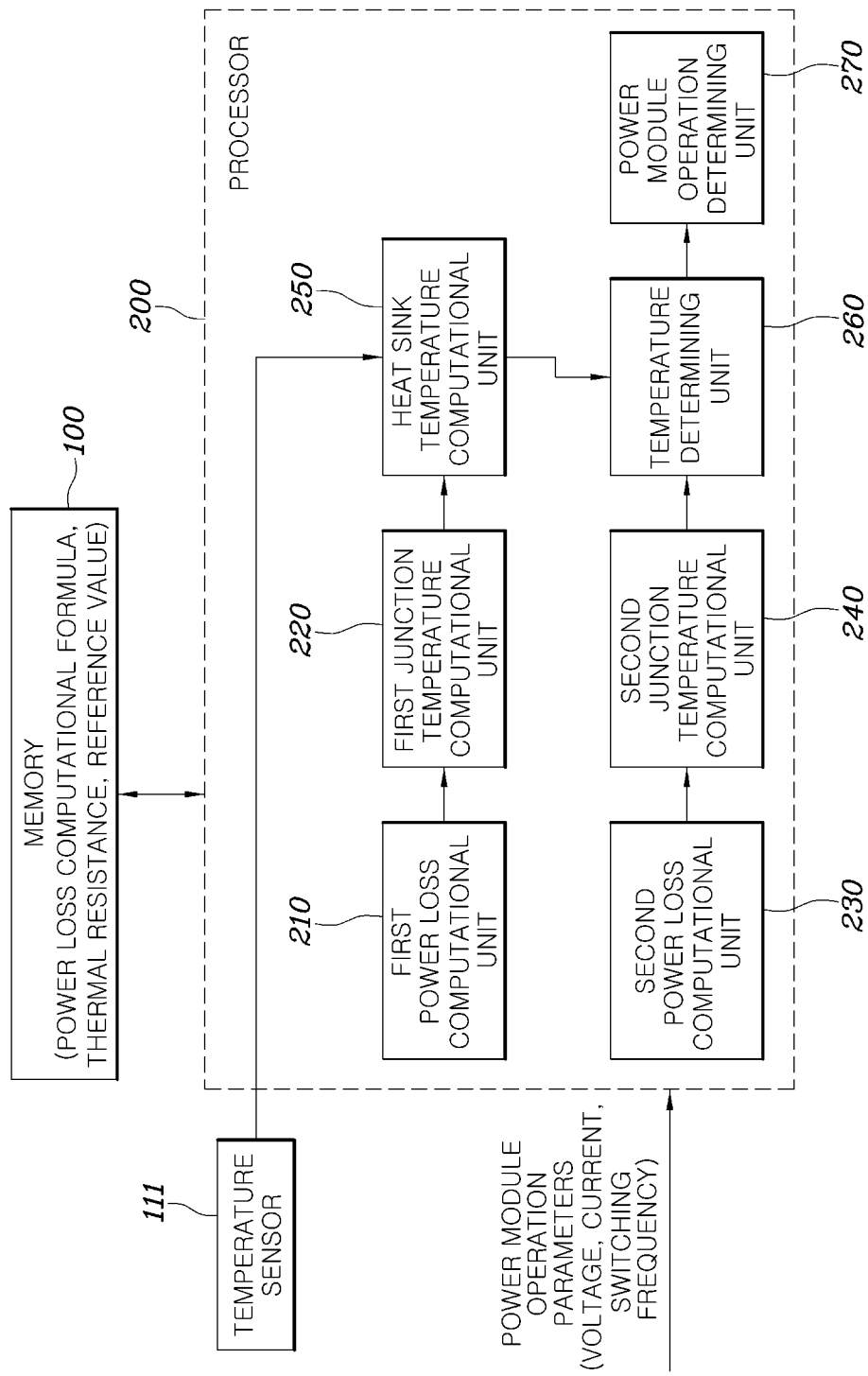
FIG. 4 is a block diagram illustrating a system for estimating a junction temperature of a power semiconductor device according to the exemplary embodiment of the present disclosure.

FIG. 4 is a block diagram illustrating a system for estimating the junction temperature of the power semiconductor device according to the exemplary embodiment of the present disclosure. Referring to FIG. 4, a system for estimating the junction temperature of the power semiconductor device according to the exemplary embodiment of the present disclosure may include a memory 100 configured to store data required for the computation of estimating and determining the junction temperature of the power semiconductor device or the computation of determining whether the power module is derated, and a processor 200 configured to perform computation or processing for receiving the data stored in the memory 100 and operation parameters of the power module to estimate the junction temperature of the power semiconductor device and determining whether the derating is performed.

The memory 100 may be configured to store previous data which are required to estimate the junction temperatures of the first and second power semiconductor devices through a thermal model. For example, the memory 100 may be configured to store a computational formula and a thermal resistance required to compute power losses of the first and second power semiconductor devices. The processor 200 may be configured to perform the computation and data processing for estimating the junction temperatures of the first and second power semiconductor devices through the thermal model, estimating the temperature of the heat sink, and thus determining the junction temperature of the second power semiconductor device. In addition, the processor 200 may be configured to perform the determination for determining whether the power module is derated or stopped according to the determined junction temperature of the second power semiconductor device.

Each of the functional blocks 210 to 270 configuring the processor 200 is a unit configured to perform computation, processing, determination, or the like executed in the processor 200, and operations thereof will be clearly described through the following explanation of a method for estimating the junction temperature of the power semiconductor device according to the exemplary embodiment of the present disclosure.

Figure 5:
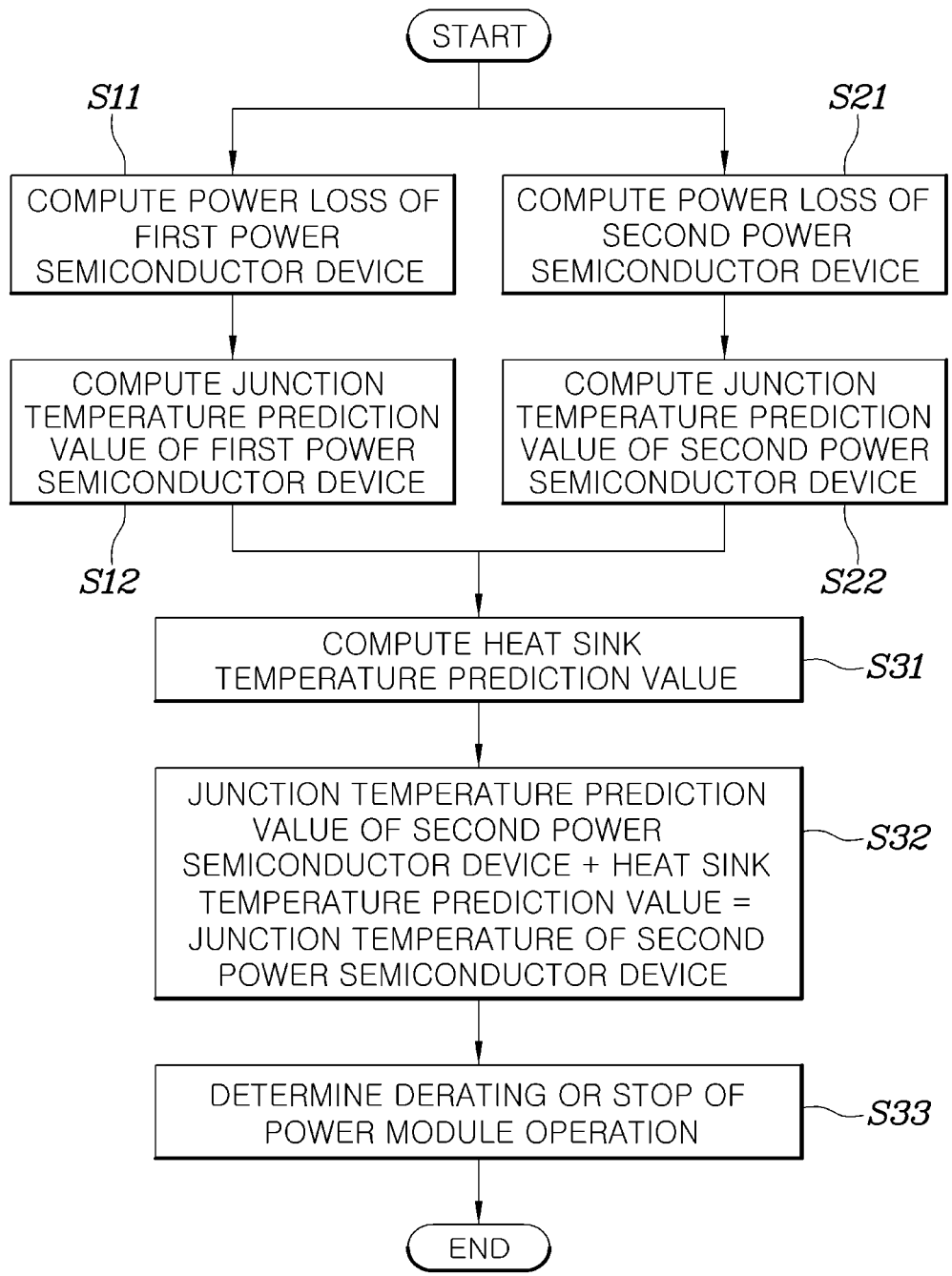
FIG. 5 is a flowchart illustrating a method for estimating the junction temperature of the power semiconductor device according to the exemplary embodiment of the present disclosure.

FIG. 5 is a flowchart illustrating a method for estimating the junction temperature of the power semiconductor device according to the exemplary embodiment of the present disclosure. Referring to FIGS. 4 and 5, a method for estimating the junction temperature of the power semiconductor device according to the exemplary embodiment of the present disclosure may start from computing a power loss of the first power semiconductor device 11 and a power loss of the second power semiconductor device 12 in a first power loss computational unit 210 and a second power loss computational unit 230, respectively (S11, S21).

The power loss of each of the power semiconductor devices may be classified into a conduction loss which occurs in a current conduction situation and a switching loss which occurs upon switching, and each loss may be computed by preset conduction loss computational formula and switching loss computational formula. The conduction loss computational formula and the switching loss computational formula may be stored in the memory 100 in advance.

The computational formula for calculating the power loss of the power semiconductor device may be set in advance based on various parameters according to the characteristics of the inverter to which the type of the power module (IGBT, diode, or the like) is applied, and determined by various methods according to a company which manufactures the power module or a company which manufactures products such as a vehicle by applying the power module. In particular, as a parameter mainly used to compute the conduction loss or the switching loss, a voltage and a current provided by the power module, a switching frequency of the power semiconductor device, and the like may be considered.

For example, the first power loss computational unit 210 may be configured to read the computational formula for computing the power loss of the first power semiconductor device 11 such as an IGBT from the memory 100, receive the voltage and current of the power module, the switching frequency of the first power semiconductor device 11, and the like from an external sensor to compute the conduction loss and the switching loss of the first power semiconductor device 11, and then sum two values to compute the power loss of the first power semiconductor device 11.

The second power loss computational unit 230 may also be configured to compute the power loss of the second power semiconductor device 12 in a similar manner. As described above, since the computational formula for calculating the power loss of the power semiconductor device may be determined in a unique manner according to manufacturers of the power semiconductor device or the power module or manufacturers which manufactures a vehicle or the like using the power module, detailed description of a specific form of the computational formula will be omitted.

Subsequently, the first junction temperature computational unit 220 and the second junction temperature computational unit 240 may be configured to compute a junction temperature prediction value of the first power semiconductor device by multiplying the power loss of the first power semiconductor device obtained by the computational formula by the thermal resistance of the first power semiconductor device stored in the memory 100 in advance, and compute a junction temperature prediction value of the second power semiconductor device by multiplying the power loss of the second power semiconductor device obtained by the computational formula by the thermal resistance of the second power semiconductor device stored in the memory 100 in advance, respectively (S12, S22).

The thermal resistance of the power semiconductor device may be determined according to the inherent characteristics of the power module including the power semiconductor device and the heat dissipation characteristics of a cooler. Accordingly, the thermal resistance of the power semiconductor device may be determined by an experimental method in advance through a driving test with a target (for example, a motor) which is powered by the power module, and the thermal resistance derived by the experimental method in advance may be stored in the memory 100.

The method of determining the thermal resistance in advance is briefly described as follows. The method may include determining the thermal resistance by driving the power module by determining the parameters (e.g., the input voltage, the input current, and the switching frequency of the power semiconductor device) of the power module for obtaining the power loss of the power semiconductor device in advance and thus obtaining the temperature of the power semiconductor device in the power module through the temperature sensor (e.g., a thermal imaging camera or the like) to confirm a change trend in the obtained temperature. For example, when the power loss occurs in each of the power semiconductor devices, the temperature of each of the power semiconductor devices may increase due to the characteristic of the thermal resistance to reach a saturation state, and at this time, a temperature change value (.e.g., a final temperature in the saturation state and a starting temperature before the current is applied) may be confirmed more easily through a thermal imaging camera by applying an experimental method.

Accordingly, the thermal resistance value may be calculated from the temperature change value of the power semiconductor device obtained through the thermal imaging camera and the power loss value obtained through the values of the input parameters (e.g., the current, the voltage, and the switching frequency) of the power semiconductor device during the experiment. In other words, the thermal resistance value in the experiment may be determined by dividing the temperature change value by the power loss computed through the parameters.

Meanwhile, since the thermal resistance value may be changed based on the heat dissipation characteristics, the liter per minute of the coolant flowing through the heat sink 20 needs to be reflected to determine the thermal resistance. Accordingly, the thermal resistance experiment may perform a thermal resistance measurement test by applying the aforementioned input parameters while changing the liter per minute (LPM) of the coolant to derive the thermal resistance corresponding to the liter per minute of each coolant. The thermal resistance data corresponding to the liter per minute of the coolant may be stored in the memory 100 in advance, and the first junction temperature computational unit 220 and the second junction temperature computational unit 240 may be configured to receive information regarding the liter per minute of the coolant from a flow meter (not illustrated) provided in a coolant supply system supplying coolant to the heat sink 20, read the thermal resistance corresponding thereto from the memory 100, and then compute the junction temperature prediction values of the first power semiconductor device 11 and the second power semiconductor device 12.

Subsequently, a heat sink temperature computational unit 250 may be configured to compute the temperature prediction value of the heat sink by subtracting the junction temperature prediction value of the first power semiconductor device 11 computed by the first junction temperature computational unit 220 from the sensing temperature sensed by the temperature sensor 111 embedded in the first power semiconductor device 11 (S31).

The sensing temperature sensed by the temperature sensor 111 embedded in the first power semiconductor device 11 may be a temperature value closest to the actual junction temperature of the first power semiconductor device 11. The junction temperature of each of the power semiconductor devices may be determined by adding the cooling temperature by the heat sink 20 to the heat-generating temperature according to each operation. Since the temperature prediction value computed by the thermal model considering the power loss and the thermal resistance of the first power semiconductor device 11 has not considered the temperature of the heat sink 20, the temperature of the heat sink 20 may be estimated by subtracting the junction temperature prediction value of the first power semiconductor device 11 computed by the first junction temperature computational unit 220 from the sensing temperature of the temperature sensor 111 corresponding to the actual junction temperature of the first power semiconductor device 11.

Subsequently, a temperature determining unit 260 may be configured to finally determine the junction temperature of the second power semiconductor device 12 by adding the heat sink temperature prediction value computed by the heat sink temperature computational unit 250 to the junction temperature prediction value of the second power semiconductor device 12 having no embedded temperature sensor (S32). The method for estimating the junction temperature of the power semiconductor device according to the exemplary embodiment of the present disclosure may further include determining whether the power module is derated or stopped based on the junction temperature of the second power semiconductor device 12 finally determined by a power module operation determining unit 270 (S33).

For example, at least one reference value which may be compared with the finally determined junction temperature of the second power semiconductor device 12 may be stored in the memory 100. The finally determined junction temperature of the second power semiconductor device 12 may then be compared with a stored first reference value and in response to determining that the finally determined junction temperature of the second power semiconductor device 12 is greater than the first reference value. The method may then include performing the derating of forcibly lowering the performance of the power module. The reference value may be a preset value which is a reference for determining whether the derating is performed.

As another example, the power module operation determining unit 270 may be configured to compare the finally determined junction temperature of the second power semiconductor device 12 with a stored second reference value and stop the operation of the power module in response to determining that the finally determined junction temperature of the second power semiconductor device 12 is greater than the second reference value. In particular, the second reference value may be a preset value which is a reference for determining whether the operation of the power module is stopped and may be a value greater than the first reference value.

As another example, a third reference value less than the first reference value may be stored, and the derating may be performed by a comparison with the first reference value, and then the derating may be released if the junction temperature of the second power semiconductor device 12 determined by performing the steps (S11, S12, S21, S22, S31, and S32) again is less than the third reference value to allow the power module to normally operate as well. The third reference value may be a predetermined value for returning the power module to a normal operation.

As described above, the method and system for estimating the junction temperature of the power semiconductor device of the power module according to various exemplary embodiments of the present disclosure may derive the temperature of the heat sink for cooling the power module by utilizing the thermal model of the power semiconductor device in which the temperature sensor is embedded and the sensing temperature of the temperature sensor, and utilize the derived temperature of the heat sink to predict the junction temperature of the power semiconductor device in which the temperature sensor is not embedded, thereby improving the accuracy of predicting the junction temperature of the power semiconductor device in which the temperature sensor is not embedded.

Particularly, the method and system for estimating the junction temperature of the power semiconductor device of the power module may predict the junction temperature of the power semiconductor device in which the temperature sensor is not embedded even in the state where a problem occurs in the system providing the coolant to the heat sink of the power module and thus the temperature of the heat sink is not accurately detected to accurately confirm the over-temperature of the junction temperature of the power semiconductor device, thereby preventing the device from being broken or the operation of the device from being stopped and the endurance life of the device from being reduced due to the over-temperature of the junction temperature.

While the specific exemplary embodiments of the present disclosure have been illustrated and described, it will be apparent to those skilled in the art that various improvements and changes of the present disclosure are possible without departing from the technical spirit of the present disclosure provided by the appended claims.

What is claimed is:

1. A method for estimating a junction temperature of a power semiconductor device of a power module and controlling the power module, the power module including a first power semiconductor device disposed adjacent to a heat sink for cooling and having a temperature sensor, and a second power semiconductor device disposed adjacent to the first power semiconductor device and having no temperature sensor, and the method comprising:
   computing, by the processor, a junction temperature prediction value of the first power semiconductor device based on a power loss and a thermal resistance of the first power semiconductor device;
   computing, by the processor, a junction temperature prediction value of the second power semiconductor device based on a power loss and a thermal resistance of the second power semiconductor device;
   computing, by the processor, a temperature prediction value of the heat sink by subtracting the junction temperature prediction value of the first power semiconductor device from a sensing temperature sensed by the temperature sensor;
   determining, by the processor, the junction temperature of the second power semiconductor device by adding the temperature prediction value of the heat sink to the junction temperature prediction value of the second power semiconductor device; and
   stopping, by the processor, an operation of the power module in response to determining that the determined junction temperature of the second power semiconductor device is greater than a preset reference value.

2. The method according to claim 1, wherein the computing of the junction temperature prediction value of the first power semiconductor device includes:
   calculating, by the processor, the power loss of the first power semiconductor device; and
   computing, by the processor, the junction temperature prediction value of the first power semiconductor device by multiplying the power loss of the first power semiconductor device by the thermal resistance of the first power semiconductor device.

3. The method according to claim 2, wherein the calculating of the power loss of the first power semiconductor device includes calculating the power loss of the first power semiconductor device using a predetermined power loss computational formula using a plurality of parameters related to the operation of the power module as variables.

4. The method according to claim 2, wherein the thermal resistance of the first power semiconductor device is determined based on a flow rate of coolant flowing through the heat sink.

5. The method according to claim 1, wherein the computing of the junction temperature prediction value of the second power semiconductor device includes:
   calculating, by the processor, the power loss of the second power semiconductor device; and
   computing, by the processor, the junction temperature prediction value of the second power semiconductor device by multiplying the power loss of the second power semiconductor device by the thermal resistance of the second power semiconductor device.

6. The method according to claim 5, wherein the calculating of the power loss of the second power semiconductor device includes calculating the power loss of the second power semiconductor device using a predetermined power loss computational formula using a plurality of parameters related to the operation of the power module as variables.

7. The method according to claim 5, wherein the thermal resistance of the second power semiconductor device is determined based on a flow rate of coolant flowing through the heat sink.

8. The method according to claim 1, wherein the first power semiconductor device is an insulated gate bipolar transistor (IGBT), and the second power semiconductor device is a diode.

9. A system for estimating a junction temperature of a power semiconductor device of a power module and controlling the power module, the power module including a first power semiconductor device disposed adjacent to a heat sink for cooling and having a temperature sensor, and a second power semiconductor device disposed adjacent to the first power semiconductor device and having no temperature sensor, and the system comprising:
   a memory configured to store a predetermined power loss computational formula of each of the first and second power semiconductor devices using a plurality of parameters as variables and a thermal resistance of each of the first and second power semiconductor devices; and
   a processor configured to determine a junction temperature of the second power semiconductor device based on information stored in the memory and a sensing temperature of the temperature sensor,
   wherein the processor is configured to:
      receive the plurality of parameters related to an operation of the power module to calculate the power loss of the first power semiconductor device, and compute a junction temperature prediction value of the first power semiconductor device based on the power loss and the thermal resistance of the first power semiconductor device,
      receive the plurality of parameters related to the operation of the power module to calculate the power loss of the second power semiconductor device, and compute a junction temperature prediction value of the second power semiconductor device based on the power loss and the thermal resistance of the first power semiconductor device,
      compute a temperature prediction value of the heat sink by subtracting the junction temperature prediction value of the first power semiconductor device from the sensing temperature sensed by the temperature sensor provided in the first power semiconductor device,
      determine the junction temperature of the second power semiconductor device by adding the temperature prediction value of the heat sink to the junction temperature prediction value of the second power semiconductor device; and
      stop an operation of the power module in response to determining that the determined junction temperature of the second power semiconductor device is greater than a preset reference value.

10. The system for estimating the junction temperature of the power semiconductor device of the power module according to claim 9, wherein the memory is configured to store the preset reference value for a comparison with the second power semiconductor device.

11. The system for estimating the junction temperature of the power semiconductor device of the power module according to claim 9, wherein the first power semiconductor device is an insulated gate bipolar transistor (IGBT), and the second power semiconductor device is a diode.

\* \* \* \* \*